(12) United States Patent
Hsu et al.

(10) Patent No.: US 10,008,506 B2
(45) Date of Patent: Jun. 26, 2018

(54) SEMICONDUCTOR ARRANGEMENT WITH CAPACITOR

(71) Applicant: Taiwan Semiconductor Manufacturing Company Limited, Hsin-Chu (TW)

(72) Inventors: Chern-Yow Hsu, Chu-Bei (TW); Chen-Jong Wang, Hsin-Chu (TW); Chia-Shiung Tsai, Hsin-Chu (TW); Shih-Chang Liu, Alian Township (TW); Xiaomeng Chen, Chung-Li (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days. days.

(21) Appl. No.: 15/362,759

(22) Filed: Nov. 28, 2016

(65) Prior Publication Data

US 2017/0077104 A1    Mar. 16, 2017

Related U.S. Application Data

(62) Division of application No. 14/087,005, filed on Nov. 22, 2013, now Pat. No. 9,508,722.

(51) Int. Cl.
| | |
|---|---|
| *H01L 21/02* | (2006.01) |
| *H01L 27/108* | (2006.01) |
| *H01L 49/02* | (2006.01) |
| *H01L 21/768* | (2006.01) |

(52) U.S. Cl.
CPC .. *H01L 27/10894* (2013.01); *H01L 21/76877* (2013.01); *H01L 27/10814* (2013.01); *H01L 27/10897* (2013.01); *H01L 28/90* (2013.01); *H01L 27/1085* (2013.01)

(58) Field of Classification Search
None
See application file for complete search history.

(56) References Cited

U.S. PATENT DOCUMENTS

| | | | |
|---|---|---|---|
| 6,326,218 B1 | 12/2001 | Yunogami et al. | |
| 6,794,694 B2 | 9/2004 | Diodato et al. | |
| 2003/0132429 A1* | 7/2003 | Kim | H01L 21/76897 257/1 |
| 2006/0063324 A1 | 3/2006 | Park et al. | |

OTHER PUBLICATIONS

Corresponding Taiwan application 103111648, Taiwan Office action dated Oct. 5, 2015, 5 pages.

* cited by examiner

*Primary Examiner* — Marc Armand
*Assistant Examiner* — Sarah Salerno
(74) *Attorney, Agent, or Firm* — Cooper Legal Group, LLC (57) ABSTRACT

A semiconductor arrangement includes a logic region and a memory region. The memory region has an active region that includes a semiconductor device. The memory region also has a capacitor within one or more dielectric layers over the active region, where the capacitor is over the semiconductor device. The semiconductor arrangement also includes a protective ring within at least one of the logic region or the memory region and that separates the logic region from the memory region. The capacitor has a first electrode, a second electrode and an insulating layer between the first electrode and the second electrode, where the first electrode is substantially larger than other portions of the capacitor.

20 Claims, 12 Drawing Sheets

SEMICONDUCTOR ARRANGEMENT WITH CAPACITOR

RELATED APPLICATION

This application is a divisional of and claims priority to U.S. patent application Ser. No. 14/087,005, titled "SEMICONDUCTOR ARRANGEMENT WITH CAPACITOR" and filed on Nov. 22, 2013, which is incorporated herein by reference.

BACKGROUND

Capacitors are useful to, among other things, store electrical charge within circuits.

DESCRIPTION OF THE DRAWINGS

Aspects of the disclosure are understood from the following detailed description when read with the accompanying drawings. It will be appreciated that elements and/or structures of the drawings are not necessarily drawn to scale. Accordingly, the dimensions of the various features may be arbitrarily increased and/or reduced for clarity of discussion.

DETAILED DESCRIPTION

Some embodiments of the disclosure will be described with reference to the drawings. The specific embodiments discussed herein are merely illustrative and do not limit the scope of the disclosure.

One or more techniques for forming a semiconductor device and resulting structures formed thereby are provided herein.

Figure 1:
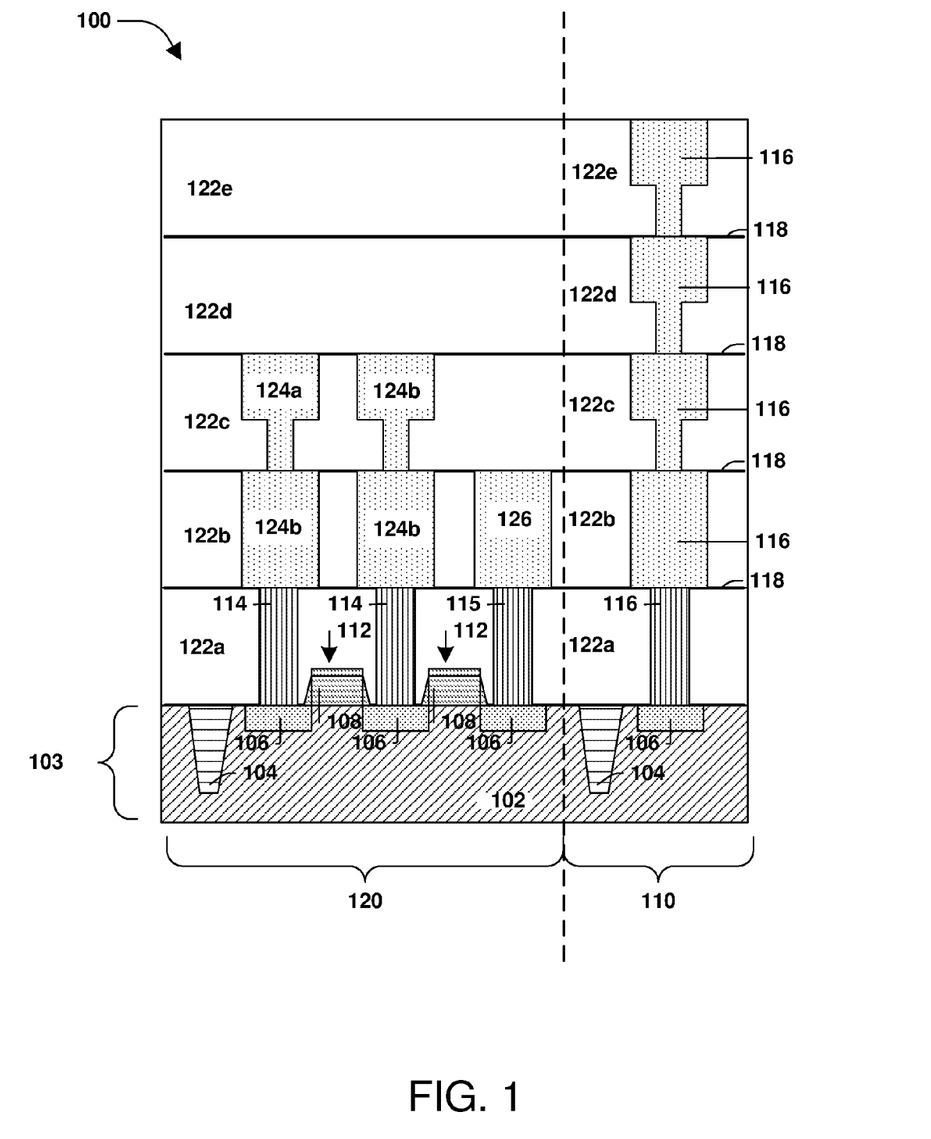
FIG. 1 illustrates a portion of a semiconductor arrangement, according to some embodiments.

FIG. 1 is a perspective view illustrating a portion of a semiconductor arrangement 100 according to some embodiments. In some embodiments, the semiconductor arrangement 100 is formed in or on a substrate 102, where an active region 103 is formed in the substrate 102. In some embodiments, the substrate 102 comprises at least one of silicon, polysilicon, germanium, or a composite or combination thereof. According to some embodiments, the substrate 102 comprises at least one of an epitaxial layer, a silicon-on-insulator (SOI) structure, a wafer, or a die formed from a wafer.

According to some embodiments, the semiconductor arrangement 100 comprises a logic region 110 and memory region 120. In some embodiments, the logic region 110 is formed on or within the active region 103. In some embodiments, the logic region 110 comprises one or more logic contacts 116 that are electrically connected within the logic region 110 and connected to the active region 103. The logic contacts 116 are formed in any number of ways, such as by a single damascene process, dual damascene process, etc.

According to some embodiments, the memory region 120 comprises one or more DRAM cells (not shown). In some embodiments, the memory region 120 comprises a semiconductor device 112 formed on or within the active region 103. In some embodiments, the semiconductor device 112 comprises at least one of gate region 108 or a source/drain region 106. In some embodiments, one or more shallow trench isolation (STI) regions 104 are formed within the active region 103. In some embodiments, the memory region 120 comprises one or more contacts 114 that are electrically connected to the source/drain regions 106.

In some embodiments, the semiconductor arrangement 100 comprises one or more dielectric layers 122 formed over the active region 103. According to some embodiments, the one or more dielectric layers 122 comprise a first dielectric layer 122a, a second dielectric layer 122b, a third dielectric layer 122c, a fourth dielectric layer 122d, and a fifth dielectric layer 122e. In some embodiments, at least one of the dielectric layers 122 comprise a standard dielectric material with a medium or low dielectric constant, such as $SiO_2$. In some embodiments, at least one of the dielectric layers 122 comprise a dielectric material with a relatively high dielectric constant. In some embodiments, formation of at least one of the dielectric layers 122 comprises at least one of thermal growth, chemical growth, atomic layer deposition (ALD), chemical vapor deposition (CVD), or plasma-enhanced chemical vapor deposition (PECVD).

In some embodiments, the semiconductor arrangement 100 comprises one or more etch stop layers 118 separating the dielectric layers 122. In some embodiments, the etch stop layers 118 stop an etching process between the dielectric layers 122. According to some embodiments, the etch stop layers 118 comprise a dielectric material having a different etch selectivity from the dielectric layers 122. In some embodiments, the etch stop layers 118 comprise at least one of SiC, SiN, SiCN, SiCO, CN, or a composite or combination thereof. In some embodiments, formation of at least one of the etch stop layers 118 comprises at least one of thermal growth, chemical growth, atomic layer deposition (ALD), chemical vapor deposition (CVD), or plasma-enhanced chemical vapor deposition (PECVD).

In some embodiments, the semiconductor arrangement 100 comprises a bit line 126. In some embodiments, the bit line 126 extends through the second dielectric layer 122b. According to some embodiments, the bit line 126 comprises a metal material and is connected to a source/drain region 106 through a contact 115.

In some embodiments, the semiconductor arrangement 100 comprises one or more metal contacts 124. In an embodiment, the metal contacts 124 extend through the third dielectric layer 122c and the second dielectric layer 122b. In some embodiments, the metal contacts 124 comprise first metal contacts 124a and second metal contacts 124b. The metal contacts 124 are formed in any number of ways, such as by a single damascene process, dual damascene process, etc. In some embodiments, the metal contacts 124 are connected to the source/drain regions 106 through contacts 114.

Figure 2:
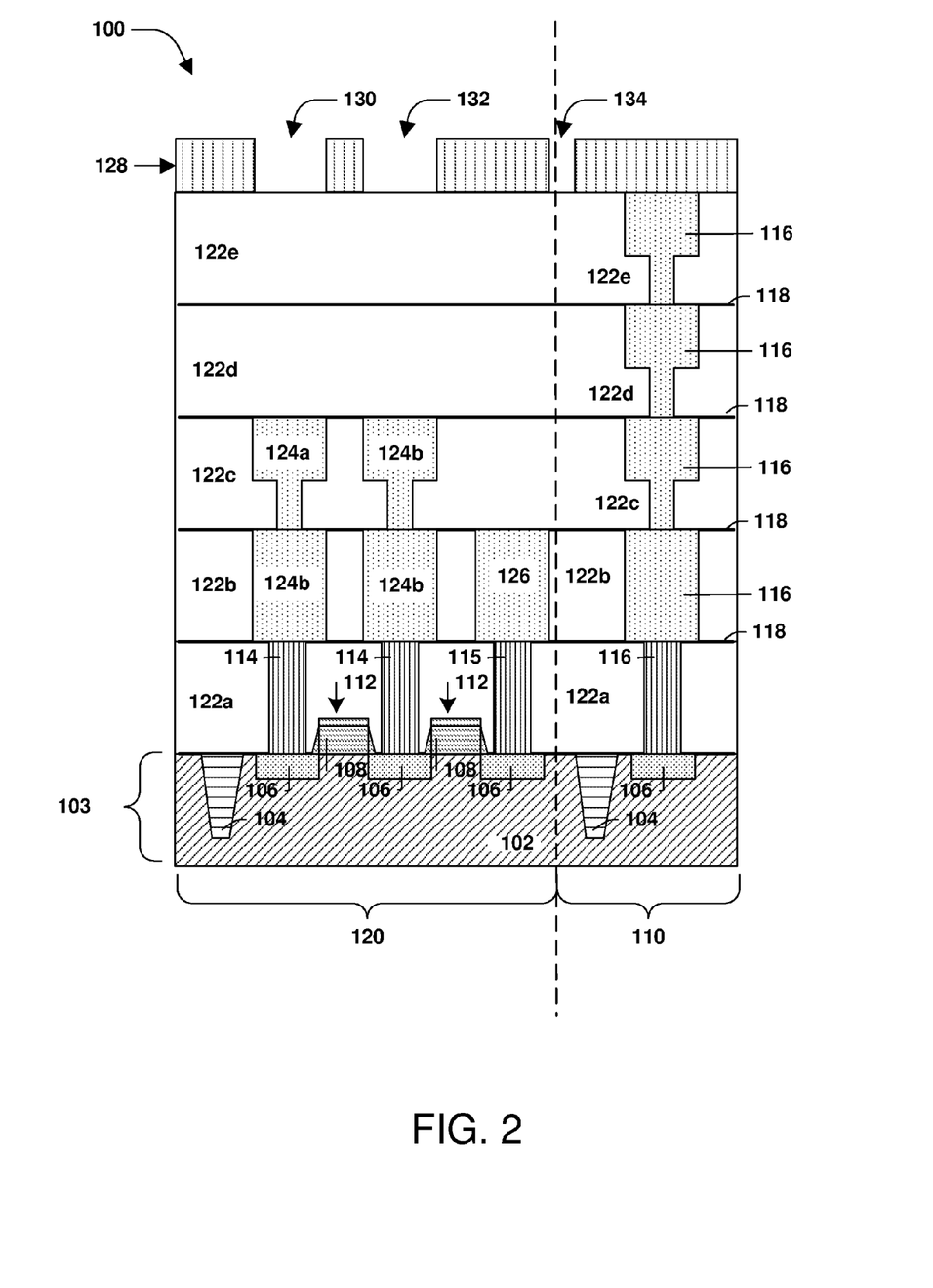
FIG. 2 illustrates a portion of a semiconductor arrangement, according to some embodiments.

Turning to FIG. 2, according to some embodiments, a first mask layer 128 is formed over the fifth dielectric layer 122e. In some embodiments, the first mask layer 128 covers portions of the logic region 110 and portions of the memory region 120. In some embodiments, formation of the first mask layer 128 comprises at least one of deposition, chemical vapor deposition (CVD), or other suitable methods. In some embodiments, the first mask layer 128 comprises at least one of oxide, silicon oxide, nitride, silicon nitride, $Si_3N_4$, or a composite or combination thereof.

In some embodiments, the first mask layer 128 is patterned, such as via etching, to form a first mask opening 130, a second mask opening 132 and a third mask opening 134, preferably concurrently or substantially at the same time or in the same process step or otherwise. In some embodiments, the first mask opening 130 is formed over the first metal contacts 124a. In some embodiments, the second mask opening 132 is formed over the second metal contacts 124b. In some embodiments, the third mask opening 134 is formed in at least one of the memory region 120 or the logic region 110.

Figure 3:
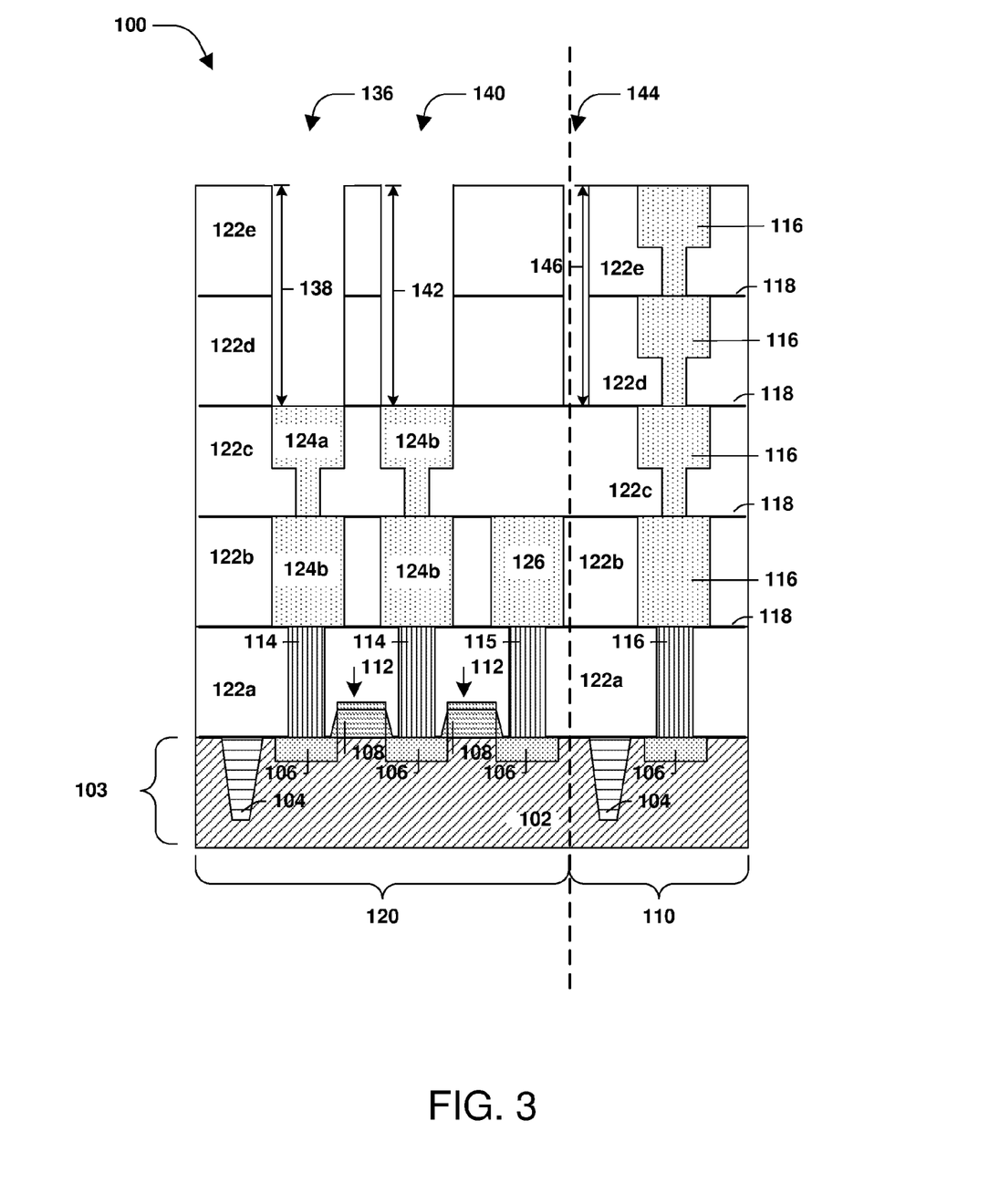
FIG. 3 illustrates a portion of a semiconductor arrangement, according to some embodiments.

Turning to FIG. 3, according to some embodiments, a first opening 136, a second opening 140, and a third opening 144 are formed in at least one or more of the dielectric layers 122. In some embodiments, formation of the first opening 136, the second opening 140 and the third opening 144 comprises etching at least one of the fifth dielectric layer 122e or the fourth dielectric layer 122d using the first mask opening 130, the second mask opening 132 and the third mask opening 134 as a guide and then removing the patterned first mask layer 128. According to some embodiments, an etch chemistry for etching through the fifth dielectric layer 122e and fourth dielectric layer 122d comprises at least one of $C_5F_8$, $C_4F_6$, $N_2$, Ar, or a composite or combination thereof. In some embodiments, an etch time for etching through at least one of the fifth dielectric layer 122e or fourth dielectric layer 122d is between about 3 minutes to about 5 minutes. In some embodiments, an etch chemistry for etching through the etch stop layer 118 between the fifth dielectric layer 122e and fourth dielectric layer 122d comprises at least one of $CF_4$, $N_2$, Ar, or a composite or combination thereof.

In some embodiments, a first depth 138 of the first opening 136 is controlled by at least one of a timed etch or endpoint detection process. In some embodiments, the first depth 138 is between about 250 nm to about 1200 nm. In some embodiments, a second depth 142 of the second opening 140 is controlled by at least one of a timed etch or endpoint detection process. In some embodiments, the second depth 142 is between about 250 nm to about 1200 nm. In some embodiments, a third depth 146 of the third opening 144 is controlled by at least one of a timed etch or endpoint detection process. In some embodiments, the third depth 146 is between about 250 nm to about 1200 nm. In some embodiments, the third depth 146 is greater than at least one of the first depth 138 or the second depth 142.

Figure 4:
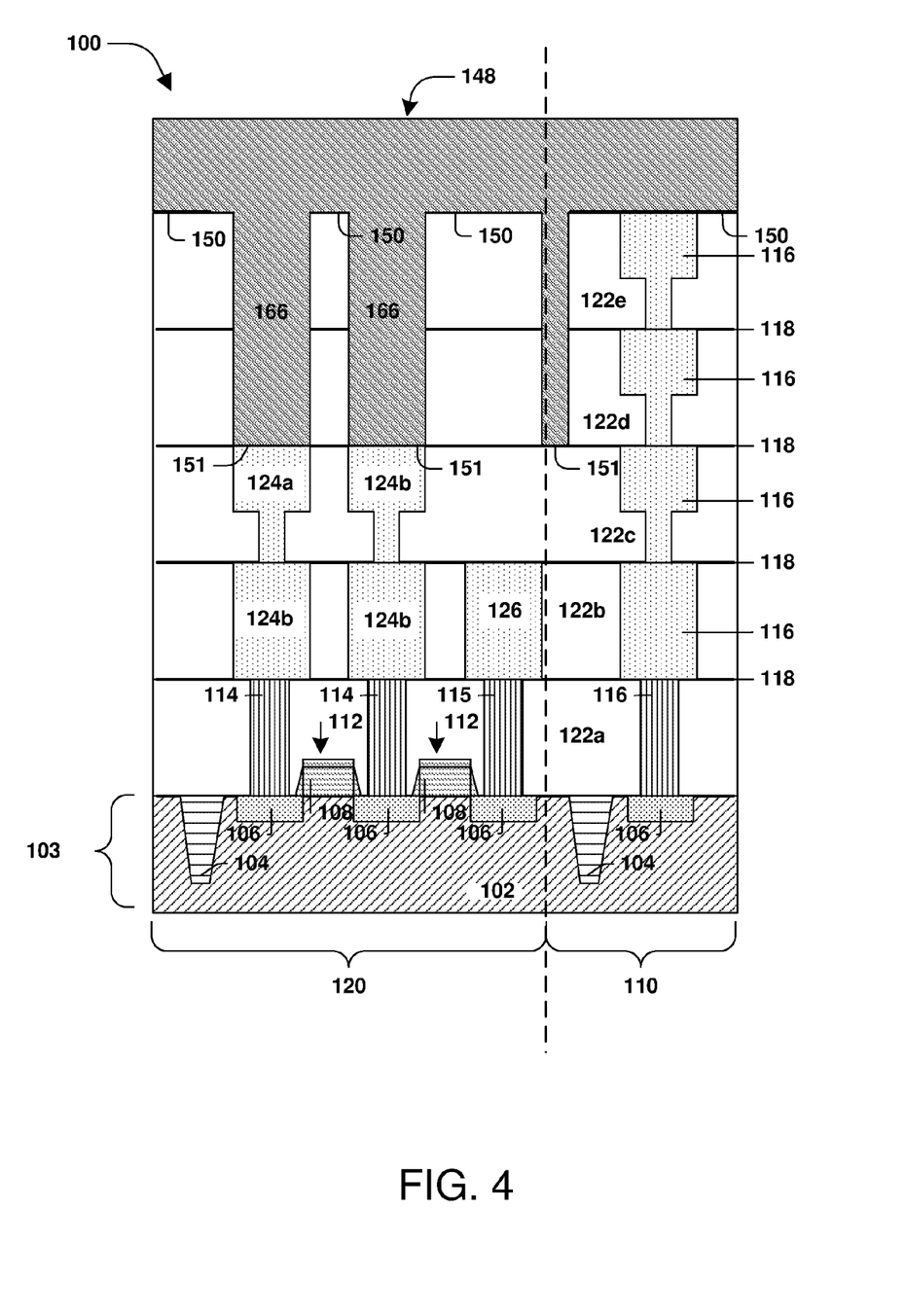
FIG. 4 illustrates a portion of a semiconductor arrangement, according to some embodiments.

Turning to FIG. 4, according to some embodiments, a first electrode layer 148 is formed within the first opening 136, the second opening 140, and the third opening 144, and over the fifth dielectric layer 122e. In some embodiments, formation of the first electrode layer 148 comprises at least one of atomic layer deposition (ALD), sputtering, thermal evaporation or chemical vapor deposition (CVD). In some embodiments, the first electrode layer 148 fills at least one of the first opening 136, the second opening 140, or the third opening 144. According to some embodiments, a portion of the first electrode layer 148 is formed over a top surface 150 of the fifth dielectric layer 122e. In some embodiments, the first electrode layer 148 comprises a conductive material. In some embodiments, the conductive material comprises at least one of Ti, TiN, Ta, TaN, TaC, W, Ir, Ru, Pt, aluminum, copper, polysilicon, or a composite or combination thereof. In some embodiments, the first electrode layer 148 is electrically connected to at least one of the first metal contacts 124a or second metal contacts 124b.

Figure 5:
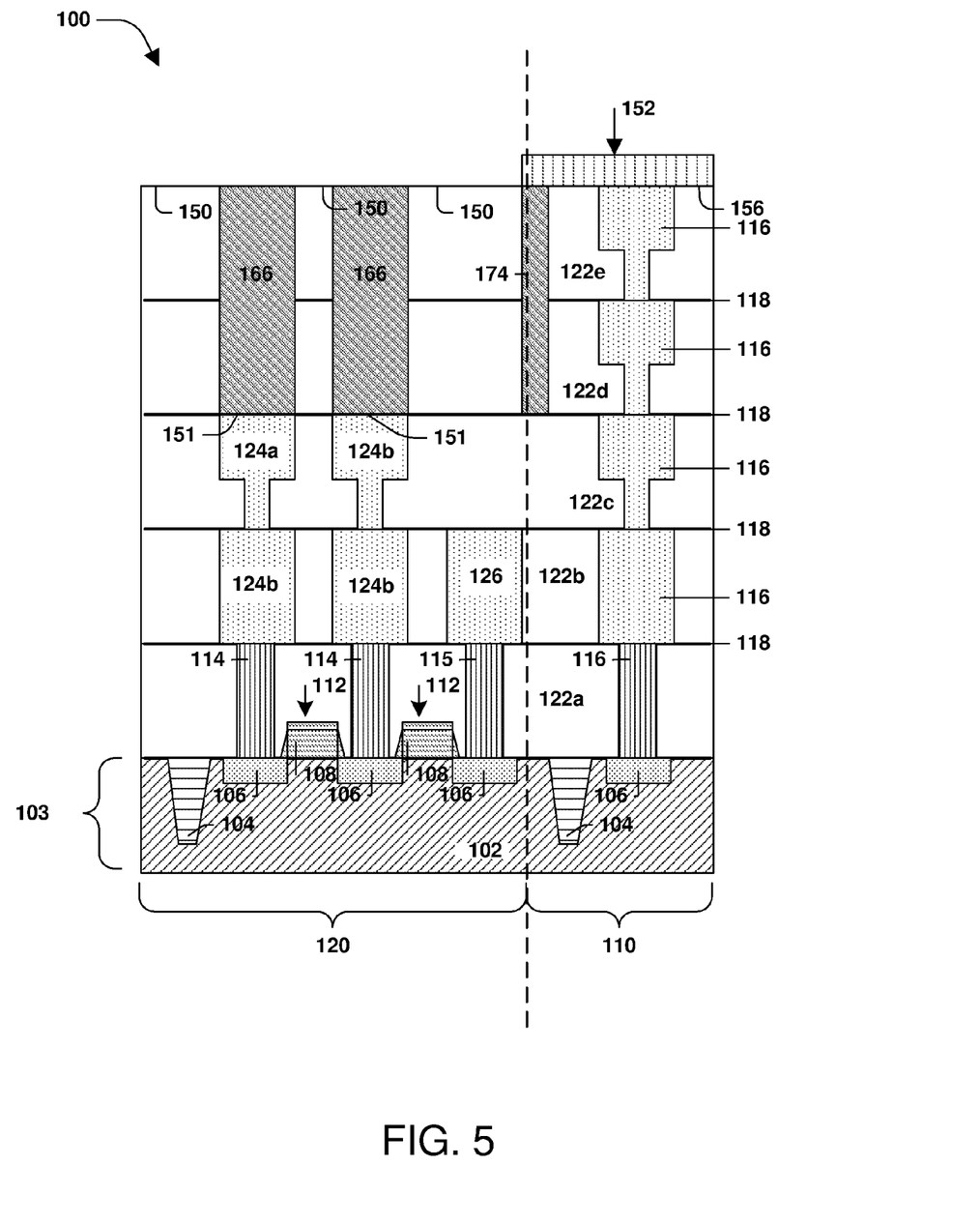
FIG. 5 illustrates a portion of a semiconductor arrangement, according to some embodiments.

In some embodiments, the first electrode layer 148 comprises a bottom surface 151 at a bottom of at least one of a first electrode 166 formed in the first opening 136 or the second opening 140, or at a protective ring 174 formed in the third opening 144, as illustrated in FIG. 5. Although two instances of the first electrode are illustrated, for producing two capacitors, any number instances of the first electrode are contemplated, to yield any number of capacitors. According to some embodiments, at least three dielectric layers 122 are between the bottom surface 151 and the active region 103. In some embodiments, the at least three dielectric layers 122 between the bottom surface 151 and the active region 103 comprise the third dielectric layer 122c, the second dielectric layer 122b, and the first dielectric layer 122a. According to some embodiments, at least one dielectric layer 122 is between the bottom surface 151 and the active region 103. In some embodiments, the at least one dielectric layer 122 between the bottom surface 151 and the active region 103 comprises the first dielectric layer 122a. According to some embodiments, at least one dielectric layer 122 is between the bottom surface 151 and the bit line 126 disposed above the active region 103. In some embodiments, the at least one dielectric layer 122 between the bottom surface 151 and the bit line 126 comprises the third dielectric layer 122c. In some embodiments, the dielectric layer 122 in contact with the bottom surface 151 also contains the bit line 126 disposed above the active region 103.

Turning to FIG. 5, in some embodiments, the portion of the first electrode layer 148 over the top surface 150 of the fifth dielectric layer 122e is removed, such as by CMP or an etching back method. In some embodiments, a second mask layer 152 is formed over the protective ring 174 and a logic region surface 156 in the logic region 110.

Figure 6:
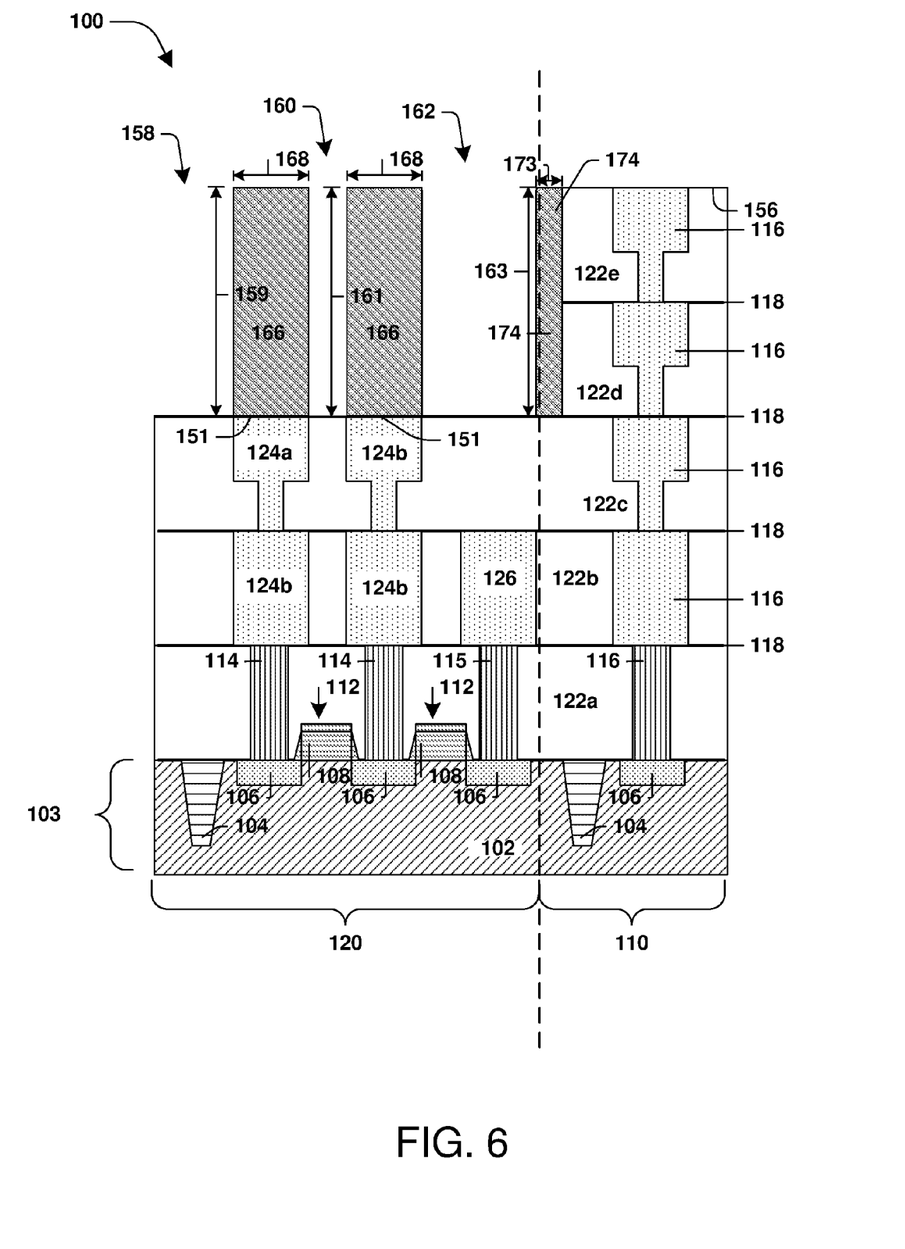
FIG. 6 illustrates a portion of a semiconductor arrangement, according to some embodiments.

Turning to FIG. 6, in some embodiments, a fourth opening 158, a fifth opening 160, and a sixth opening 162 are formed, such as via etching at least one of the fifth dielectric layer 122e or the fourth dielectric layer 122d. According to some embodiments, an etch chemistry for etching through at least one of the fifth dielectric layer 122e or fourth dielectric layer 122d comprises at least one of $C_5F_8$, $C_4F_6$, $N_2$, Ar, or a composite or combination thereof. According to some embodiments, an etch chemistry for etching through at least one of the fifth dielectric layer 122e or fourth dielectric layer 122d comprises a wet etching method using a hydrogen fluoride (HF) base chemical. In some embodiments, an etch time for etching through at least one of the fifth dielectric layer 122e or the fourth dielectric layer 122d is between about 3 minutes to about 5 minutes. In some embodiments, an etch chemistry for etching through the etch stop layer 118 between the fifth dielectric layer 122e and fourth dielectric layer 122d comprises at least one of $CF_4$, $N_2$, Ar, or a composite or combination thereof. In some embodiments, the first electrode 166 has a first electrode width 168, and the protective ring 174 has a protective ring width 173. In some embodiments, the first electrode width 168 is between about 15 nm to about 180 nm. In some embodiments, the protective ring width 173 is between about 1 nm to about 100 nm. In some embodiments, the fourth opening 158 has a fourth depth 159, the fifth opening 160 has a fifth depth 161 and the sixth opening 162 has a sixth depth 163. In some embodiments, the fourth depth 159 is controlled by at least one of a timed etch or endpoint detection process. In some embodiments, the fourth depth 159 is between about 250 nm to about 1200 nm. In some embodiments, the fifth depth 161 is controlled by at least one of a timed etch or endpoint detection process. In some embodiments, the fifth depth 161 is between about 250 nm to about 1200 nm. In some embodiments, a sixth depth 163 is controlled by at least one of a timed etch or endpoint detection process. In some embodiments, the sixth depth 163 is between about 250 nm to about 1200 nm. In some embodiments, the sixth depth 163 is less than at least one of the fourth depth 159 or the fifth depth 161. In some embodiments, less than all of at least one of the fifth dielectric layer 122e or the fourth dielectric layer 122d is removed such that a sidewall of at least one of the first electrode 166 or a sidewall of the protective ring 174 are not entirely revealed.

Figure 7:
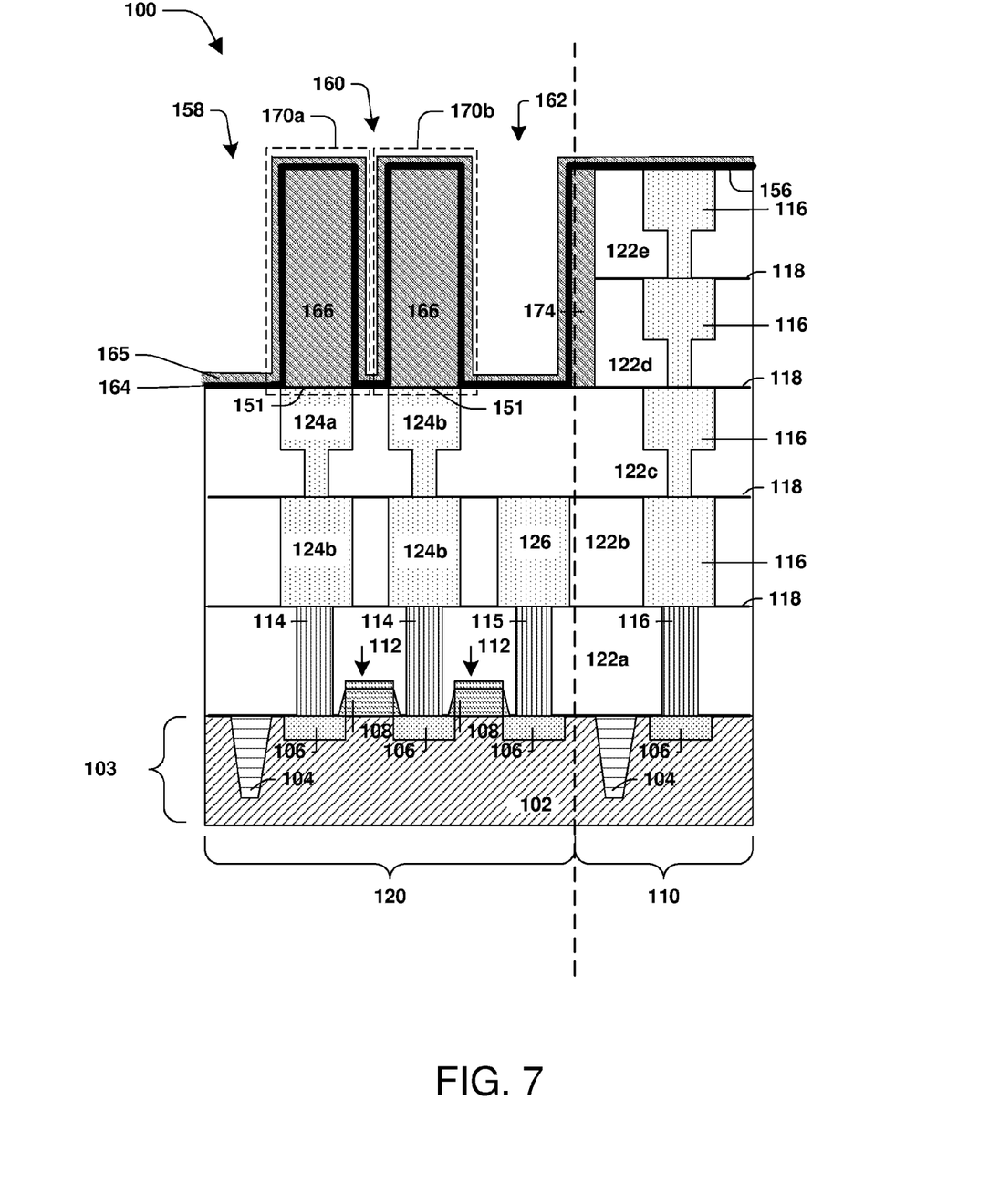
FIG. 7 illustrates a portion of a semiconductor arrangement, according to some embodiments.

Turning to FIG. 7, in some embodiments, an insulating layer 164 is formed over the first electrode 166, the protective ring 174, in the fourth opening 158, the fifth opening 160 and the sixth opening 162, and over the logic region surface 156. In some embodiments, the insulating layer 164 comprises a dielectric material with a relatively high dielectric constant such as a material comprising at least one of $Al_2O_3$, $ZrO_2$, $Ta_2O_5$, $HfO_2$, $La_2O_3$, $TiO_2$, $SiO_2$, or a composite or combination thereof. In some embodiments, the insulating layer 164 comprises a standard dielectric material with a medium or low dielectric constant, such as $SiO_2$. In some embodiments, formation of the insulating layer 164 comprises at least one of thermal growth, chemical growth, atomic layer deposition (ALD), chemical vapor deposition (CVD), or plasma-enhanced chemical vapor deposition (PECVD).

According to some embodiments, a second electrode 165 is formed over the insulating layer 164 to form a capacitor 170. Although first 170a and second 170b capacitors are illustrated, any number of capacitors are contemplated. In some embodiments, formation of the second electrode 165 comprises at least one of atomic layer deposition (ALD), sputtering, or thermal evaporation, chemical vapor deposition (CVD). In some embodiments, the second electrode 165 comprises a conductive material. In some embodiments, a conductive material comprises at least one of Ti, TiN, Ta, TaN, TaC, W, Ir, Ru, Pt, aluminum, copper, polysilicon, or a composite or combination thereof. According to some embodiments, the insulating layer 164 is between at least one of the first electrode 166 and the second electrode 165, the protective ring 174 and the second electrode 165, or the second electrode 165 and an etch stop layer 118.

Figure 8:
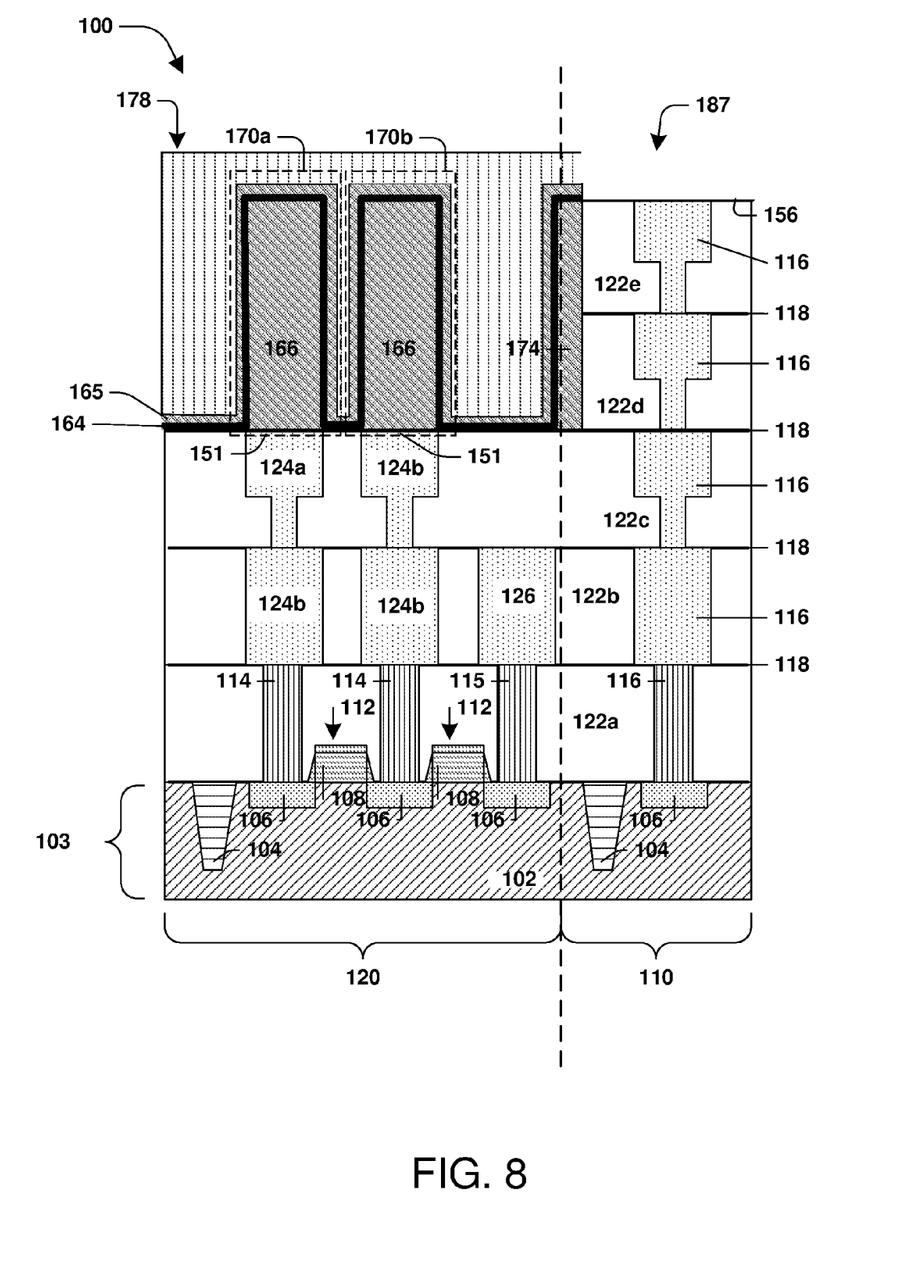
FIG. 8 illustrates a portion of a semiconductor arrangement, according to some embodiments.

Turning to FIG. 8, according to some embodiments a third mask layer 178 is formed over the second electrode 165. In some embodiments, formation of the third mask layer 178 comprises at least one of chemical vapor deposition (CVD), or other suitable methods. In some embodiments, the third mask layer 178 comprises at least one of oxide, silicon oxide, nitride, silicon nitride, $Si_3N_4$, or a composite or combination thereof. In some embodiments, a fourth mask opening 187 is formed over the logic region surface 156 by removing, such as by metal etching portions of the third mask layer 178, second electrode 165 and insulating layer 164 over the logic region surface 156.

Figure 9:
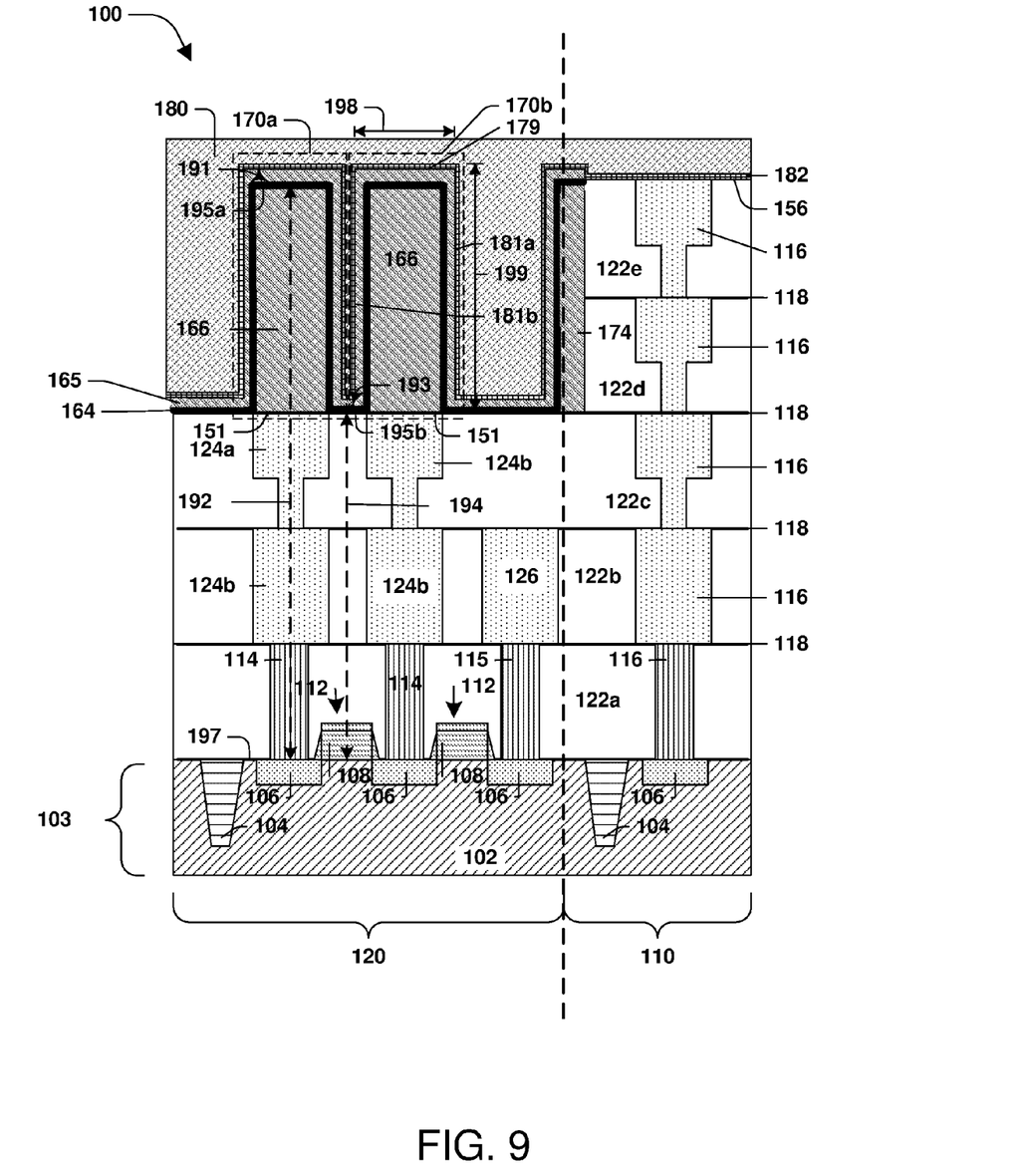
FIG. 9 illustrates a portion of a semiconductor arrangement, according to some embodiments.

Turning to FIG. 9, according to some embodiments, the third mask layer 178 is removed and an etch stop layer 182 is formed over the second electrode 165 and the logic region surface 156. In some embodiments, the etch stop layer 182 stops an etching process from reaching the fifth dielectric layer 122e. In some embodiments, the etch stop layer 182 comprises at least one of SiC, SiN, SiCN, SiCO, CN, or a composite or combination thereof. In some embodiments, formation of the etch stop layer 182 comprises at least one of thermal growth, chemical growth, atomic layer deposition (ALD), chemical vapor deposition (CVD), or plasma-enhanced chemical vapor deposition (PECVD). In some embodiments, an oxide layer 180 is formed over the etch stop layer 182. In some embodiments, formation of the oxide layer 180 comprises at least one of deposition, chemical vapor deposition (CVD), or other suitable methods. In some embodiments, the oxide layer 180 comprises at least one of oxide, silicon oxide, nitride, silicon nitride, oxynitride, or $SiO_2$.

In some embodiments, the capacitor 170 comprises the first electrode 166, the insulating layer 164, and the second electrode 165. In some embodiments, the capacitor 170 extends between 1 dielectric layer 122 to 10 dielectric layers 122. In some embodiments, a height 199 of the capacitor 170 is measured from the bottom surface 151 of the first electrode 166 to a top capacitor surface 179 of the second electrode 165. In some embodiments, the height 199 of the capacitor 170 is between about 250 nm to about 1200 nm.

In some embodiments, a width 198 of the capacitor 170 is measured between opposing side surfaces 181a and 181b of the second electrode 165. In some embodiments, the width 198 of the capacitor 170 is between about 30 nm to about 200 nm. According to some embodiments, an aspect ratio is a measurement of a ratio of the height 199 of the capacitor 170 to the width 198 of the capacitor 170. In some embodiments, the aspect ratio of the capacitor 170 is between about 5 to about 25.

In some embodiments, a first portion 191 of the insulating layer 164 is a first distance 192 from the active region 103. In some embodiments, the first distance 192 is measured from a first bottom insulating surface 195a of the first portion 191 of the insulating layer 164 to a top active region surface 197 of the active region 103. In some embodiments, a second portion 193 of the insulating layer 164, adjacent the capacitor 170, is a second distance 194 from the active region 103. In some embodiments, the second distance 194 is measured from a second bottom insulating surface 195b of the second portion 193 of the insulating layer 164 to the top active region surface 197. In some embodiments, the first portion 191 of the insulating layer 164 is over the first electrode 166. In some embodiments, the second portion 193 of the insulating layer 164 is adjacent the capacitor and thus is not over a metal contact 124. In some embodiments, the bottom surface 151 of the first electrode 166 is in contact with a metal contact 124. In some embodiments, the metal contact 124, which is in contact with the bottom surface 151 of the first electrode 166, provides an electrical connection through the dielectric layer 122 to the semiconductor device 112. In some embodiments, the first distance 192 is greater than the second distance 194.

In some embodiments, the first electrode, in contact with the metal contact 124, has a first area, comprising the first electrode width 168 times a height of the first electrode, where the height of the first electrode 166 corresponds to the first depth 138 illustrated in FIG. 3. In some embodiments, the second electrode of the capacitor 170 has a second area. In some embodiments, the first area is at least 5 times greater than the second area.

Figure 10:
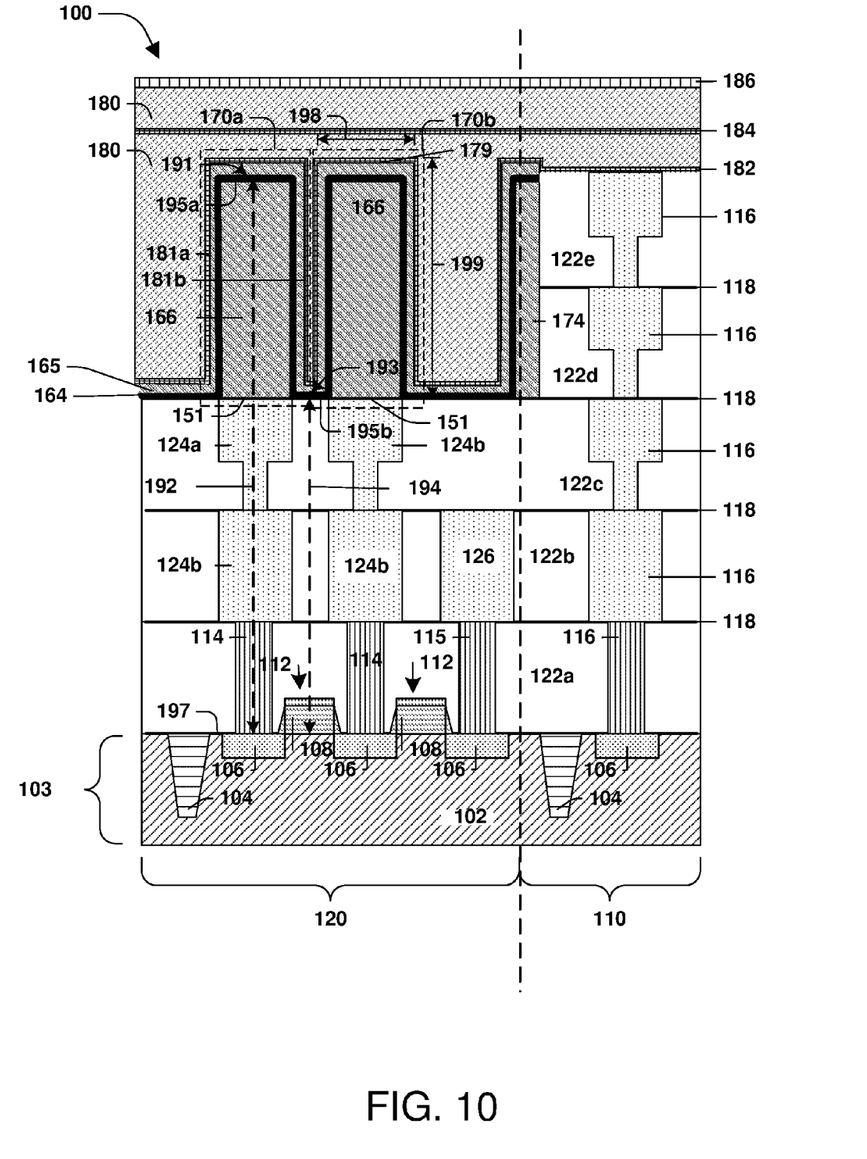
FIG. 10 illustrates a portion of a semiconductor arrangement, according to some embodiments.

Turning to FIG. 10, according in some embodiments an etch stop layer 184 is formed over the oxide layer 180. According to some embodiments, the etch stop layer 184 comprises a dielectric material having a different etch selectivity than the oxide layer 180. In some embodiments, the etch stop layer 184 comprises at least one of SiC, SiN, SiCN, SiCO, CN, or a composite or combination thereof. In some embodiments, formation of the etch stop layer 184 comprises at least one of thermal growth, chemical growth, atomic layer deposition (ALD), chemical vapor deposition (CVD), or plasma-enhanced chemical vapor deposition (PECVD). In some embodiments, at least one additional oxide layer 180 is formed over the etch stop layer 184. In some embodiments, multiple additional oxide layers, such as nine layers, are formed over the etch stop layer 184, with additional etch stop layers separating the additional oxide layers. In some embodiments, an antireflective coating (ARC) layer 186 is formed such as by CVD or other suitable methods over the oxide layer 180. In some embodiments, the ARC layer 186 comprises metal or metal oxide. In some methods, the ARC layer 186 is formed by deposition.

Figure 11:
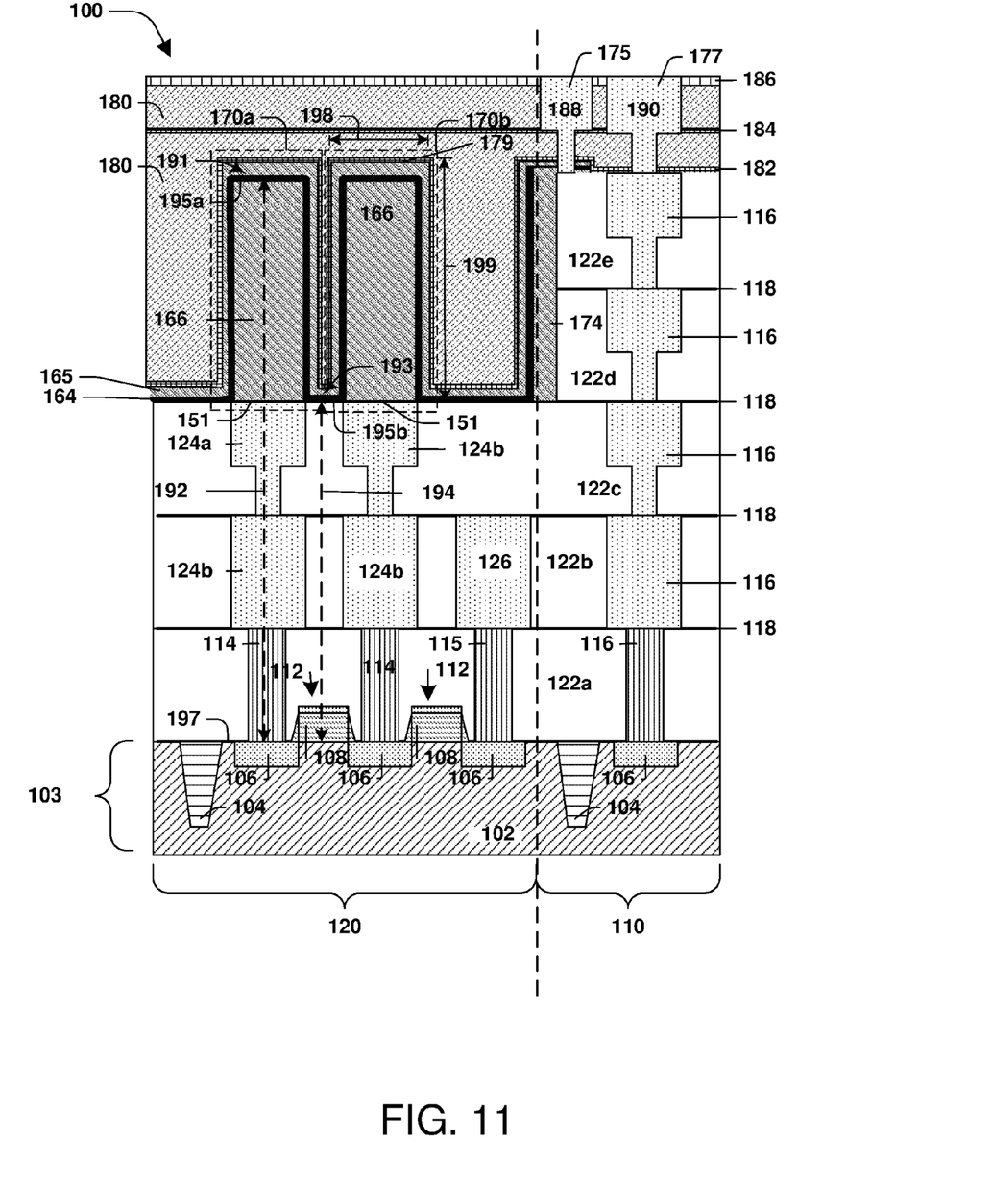
FIG. 11 illustrates a portion of a semiconductor arrangement, according to some embodiments.

Turning to FIG. 11, according to some embodiments a first oxide opening 175 and a second oxide opening 177 are formed in the ARC layer 186, the oxide layer 180 and the etch stop layer 184. The formation of the first oxide opening 175 and the second oxide opening 177 comprising at least one of wet etching or dry etching.

According to some embodiments, a pick up contact 188 is formed in the first oxide opening 175. In some embodiments, the pick up contact 188 extends through the ARC layer 186, the oxide layer 180 and the etch stop layers 182, 184. In some embodiments, the pick up contact 188 is in contact with the insulating layer 164 and the second electrode 165. In some embodiments, formation of the pick up contact 188 comprises at least one of a single damascene process or dual damascene process.

According to some embodiments, a via contact 190 is formed in the second oxide opening 177. In some embodiments, the via contact 190 extends through the ARC layer 186, the oxide layer 180 and the etch stop layers 182, 184. In some embodiments, the via contact 190 is in contact with the logic contact 116. In some embodiments, formation of the via contact 190 comprises at least one of a single damascene process or dual damascene process.

Figure 12:
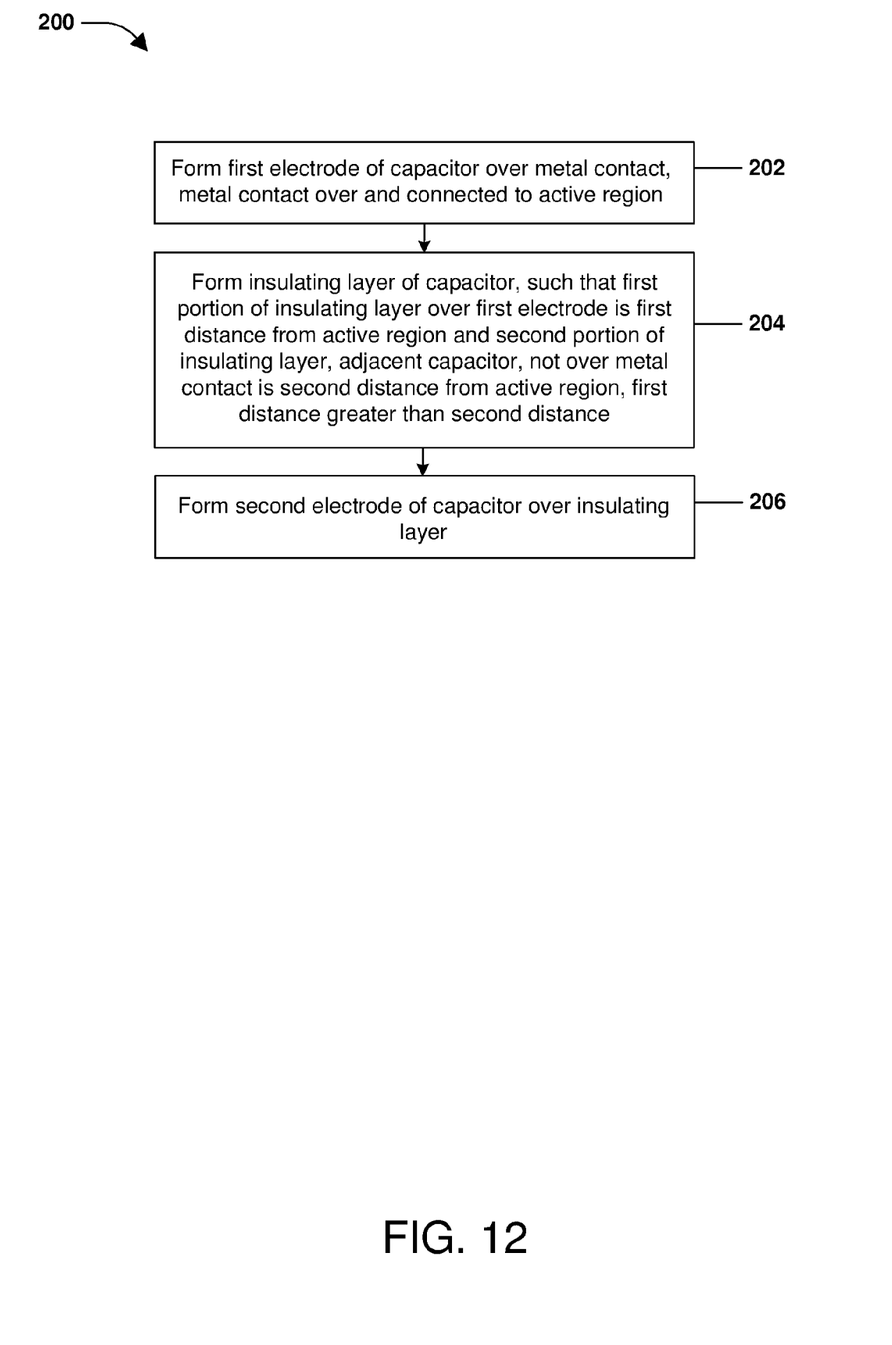
FIG. 12 illustrates a method of forming a semiconductor arrangement, according to some embodiments.

An example method 200 of forming a semiconductor arrangement, such as semiconductor arrangement 100 according to some embodiments, is illustrated in FIG. 12.

At 202, according to some embodiments, a first electrode 166 of a capacitor is formed over a metal contact 124, where the metal contact 124 is in a dielectric layer 122 and over an active region 103 and has an electrical connection to a semiconductor device 112 in the active region 103, as illustrated in FIG. 6.

At 204, according to some embodiments, an insulating layer 164 of the capacitor 170 is formed, such that a first portion 191 of the insulating layer 164 is a first distance 192 from the active region 103, a second portion 193 of the insulating layer 164 adjacent the capacitor 170 is a second distance 194 from the active region 103 and the first distance 192 is greater than the second distance 194, as illustrated in FIG. 9. In some embodiments, the first distance 192 is measured from a first bottom insulating surface 195a to a top active region surface 197. In some embodiments, the second distance 194 is measured from a second bottom insulating surface 195b to the top active region surface 197. In some embodiments, the first portion 191 of the insulating layer 164 is formed over the first electrode 166. In some embodiments, the second portion 193 of the insulating layer 164 is adjacent the capacitor and thus is not over a metal contact 124. In some embodiments, the bottom surface 151 of the first electrode 166 is in contact with a metal contact 124. In some embodiments, the metal contact 124, which is in contact with the bottom surface 151 of the first electrode 166, provides an electrical connection through the dielectric layer 122 to a semiconductor device 112 in the active region 103, as illustrated in FIG. 9. At 206 a second electrode 165 is formed over the insulating layer 164 to form the capacitor 170, as illustrated in FIG. 9.

In some embodiments, a semiconductor arrangement comprises an active region comprising a semiconductor device, and a capacitor. In some embodiments, the capacitor has a first electrode, a second electrode and an insulating layer between the first electrode and the second electrode, such that first portion of the insulating layer is a first distance from the active region, and a second portion of the insulating layer, adjacent the capacitor, is a second distance from the active region. In some embodiments, the first distance is greater than the second distance. In some embodiments, the first portion is over a metal contact formed in a dielectric layer over the active region. In some embodiments, the metal contact provides an electrical connection through the dielectric layer to the semiconductor device. In some embodiment, the second portion is over the dielectric layer but not over the metal contact.

In some embodiments, a semiconductor arrangement comprises a logic region, a memory region and a protective ring. In some embodiments, the protective ring is in at least one of the logic region or the memory region and separating the logic region from the memory region. In some embodiments, the memory region comprises an active region and a capacitor. In some embodiments, the active region comprises a semiconductor device. In some embodiments, the capacitor is within one or more dielectric layers over the active region and the capacitor is over the semiconductor device.

In some embodiments, a method of forming a semiconductor arrangement comprises forming a first electrode of a capacitor over a metal contact and forming an insulating layer of the capacitor. In some embodiments, the metal contact is formed in a dielectric layer over an active region of the semiconductor arrangement. In some embodiments, the metal contact provides an electrical connection through the dielectric layer to a semiconductor device of the active region. In some embodiments, the insulating layer of the capacitor is formed such that a first portion of the insulating layer over the first electrode is a first distance from the active region and a second portion of the insulating layer, adjacent the capacitor, over the dielectric layer, but not over the metal contact, is a second distance from the active region. In some embodiments, the first distance is greater than the second distance.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, regions, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as implanting techniques, doping techniques, spin-on techniques, sputtering techniques, growth techniques, such as thermal growth and/or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first region and a second region generally correspond to region A and region B or two different or two identical regions or the same type region.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor arrangement, comprising:
   etching a first opening in a first dielectric layer to expose a metal contact in a second dielectric layer underlying the first dielectric layer, wherein the metal contact provides an electrical connection through the second dielectric layer to a semiconductor device;
   etching a second opening in the first dielectric layer to expose a first portion of the second dielectric layer;
   forming a first conductive layer in the first opening and the second opening, wherein a portion of the first conductive layer in the first opening defines a first electrode and a portion of the first conductive layer in the second opening defines a protective ring;
   removing a portion of the first dielectric layer between the first electrode and the protective ring to expose a second portion of the second dielectric layer; and
   forming an insulating layer over the first electrode, the second portion of the second dielectric layer, and the protective ring.

2. The method of claim 1, wherein the protective ring delineates between a memory region and a logic region of the semiconductor arrangement and the method comprises:
   forming a mask over the logic region prior to removing the portion of the first dielectric layer between the first electrode and the protective ring.

3. The method of claim 2, wherein the mask is formed over a portion of the first dielectric layer in the logic region to protect the portion of the first dielectric layer in the logic region from removal while removing the portion of the first dielectric layer between the first electrode and the protective ring.

4. The method of claim 3, comprising:
   removing the mask prior to forming the insulating layer, wherein forming the insulating layer comprises forming the insulating layer over the portion of the first dielectric layer in the logic region.

5. The method of claim 4, wherein the insulating layer contacts the second portion of the second dielectric layer and the portion of the first dielectric layer in the logic region.

6. The method of claim 2, comprising removing the mask prior to forming the insulating layer.

7. The method of claim 1, wherein the insulating layer contacts the first electrode, the second portion of the second dielectric layer, and the protective ring.

8. The method of claim 1, comprising:
   forming a second conductive layer over the insulating layer.

9. The method of claim 8, wherein the protective ring delineates between a memory region and a logic region of the semiconductor arrangement and the method comprises:
   forming a mask over the second conductive layer in the memory region; and
   removing a portion of the second conductive layer and a portion of the insulating layer in the logic region.

10. The method of claim 9, wherein removing the portion of the second conductive layer and the portion of the insulating layer in the logic region exposes a logic contact in the first dielectric layer.

11. The method of claim 10, comprising:
    forming a second insulating layer over the second conductive layer and the logic contact; and
    forming a via contact in the second insulating layer over the logic contact.

12. The method of claim 1, wherein etching the first opening and etching the second opening are performed concurrently.

13. A method of forming a semiconductor arrangement, comprising:
    forming a first conductive layer in a first opening defined in a first dielectric layer and a second opening defined in the first dielectric layer, wherein a portion of the first conductive layer in the first opening defines a first electrode and a portion of the first conductive layer in the second opening defines a protective ring;

removing a portion of the first dielectric layer between the first electrode and the protective ring to expose a second dielectric layer; and forming an insulating layer in contact with a top surface of the first electrode, a top surface of the protective ring, and a top surface the second dielectric layer between the first electrode and the protective ring.

14. The method of claim 13, wherein the protective ring delineates between a memory region and a logic region of the semiconductor arrangement and the method comprises:

forming a mask over the logic region prior to removing the portion of the first dielectric layer between the first electrode and the protective ring to protect a portion of the first dielectric layer in the logic region from removal while removing the portion of the first dielectric layer between the first electrode and the protective ring.

15. The method of claim 14, comprising:

removing the mask prior to forming the insulating layer, wherein forming the insulating layer comprises forming the insulating layer over the portion of the first dielectric layer in the logic region.

16. The method of claim 13, comprising:

forming a second conductive layer over the insulating layer, wherein the second conductive layer defines a second electrode.

17. The method of claim 16, wherein the protective ring delineates between a memory region and a logic region of the semiconductor arrangement and the method comprises:

forming a mask over the second conductive layer in the memory region; and removing a portion of the second conductive layer and a portion of the insulating layer in the logic region.

18. The method of claim 17, wherein removing the portion of the second conductive layer and the portion of the insulating layer in the logic region exposes a logic contact in the first dielectric layer.

19. The method of claim 13, wherein the first opening and the second opening are further defined in a third dielectric layer overlying the first dielectric layer.

20. A method of forming a semiconductor arrangement, comprising:

etching a first opening in a first dielectric layer to expose a metal contact in a second dielectric layer underlying the first dielectric layer;

etching a second opening in the first dielectric layer to expose a first portion of the second dielectric layer;

forming a first conductive layer in the first opening and the second opening, wherein a portion of the first conductive layer in the first opening defines a first electrode and a portion of the first conductive layer in the second opening defines a protective ring;

removing a portion of the first dielectric layer between the first electrode and the protective ring to expose a second portion of the second dielectric layer; and forming an insulating layer, wherein the insulating layer contacts a first sidewall of the protective ring and the first dielectric layer contacts a second sidewall of the protective ring.

* * * * *